United States Patent [19]

Zemek et al.

[11] 4,029,131

[45] June 14, 1977

[54] NON-AXIAL LEAD ELECTRICAL COMPONENT PREPPER-TAPER APPARATUS

[75] Inventors: Albert W. Zemek, Windsor; Robert H. Holmes; David L. Merithew, both of Binghamton, all of N.Y.

[73] Assignee: Universal Instruments Corporation, Binghamton, N.Y.

[22] Filed: Sept. 1, 1976

[21] Appl. No.: 719,516

Related U.S. Application Data

[62] Division of Ser. No. 650,674, Jan. 20, 1976, Pat. No. 3,987,528.

[52] U.S. Cl. .......................... 140/105; 72/DIG. 10
[51] Int. Cl.² ..................................... B21F 45/00
[58] Field of Search .......... 140/1, 105; 72/DIG. 10

[56] References Cited

UNITED STATES PATENTS

| 3,945,408 | 3/1976 | Halligan | 140/105 |
| 4,003,413 | 1/1977 | Hanson et al. | 140/105 |

*Primary Examiner*—Lowell A. Larson
*Attorney, Agent, or Firm*—Fidelman, Wolffe & Waldron

[57] ABSTRACT

An apparatus for sequentially feeding non-axial lead electrical components in their manufacturing strips from a magazine to a forming station where they are removed, bent into a substantially axial lead configuration and taped between two pairs of continuous ribbons of tape. The leads are straightened while in the manufacturing strip by being placed under tension.

8 Claims, 26 Drawing Figures

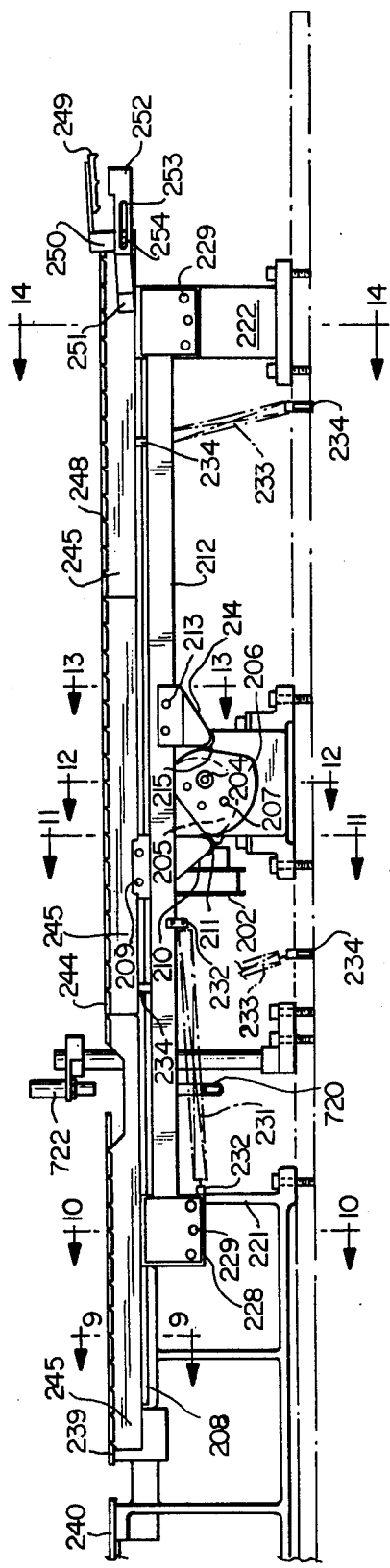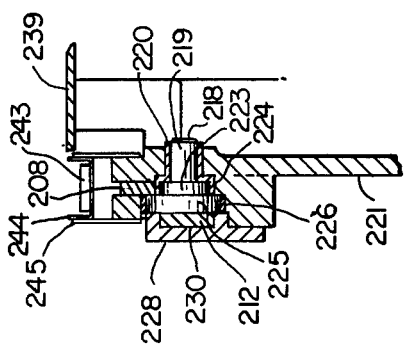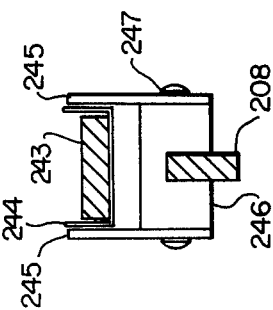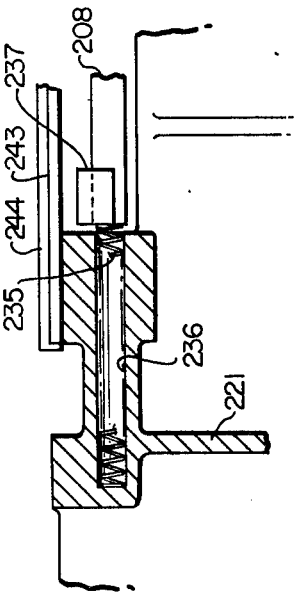

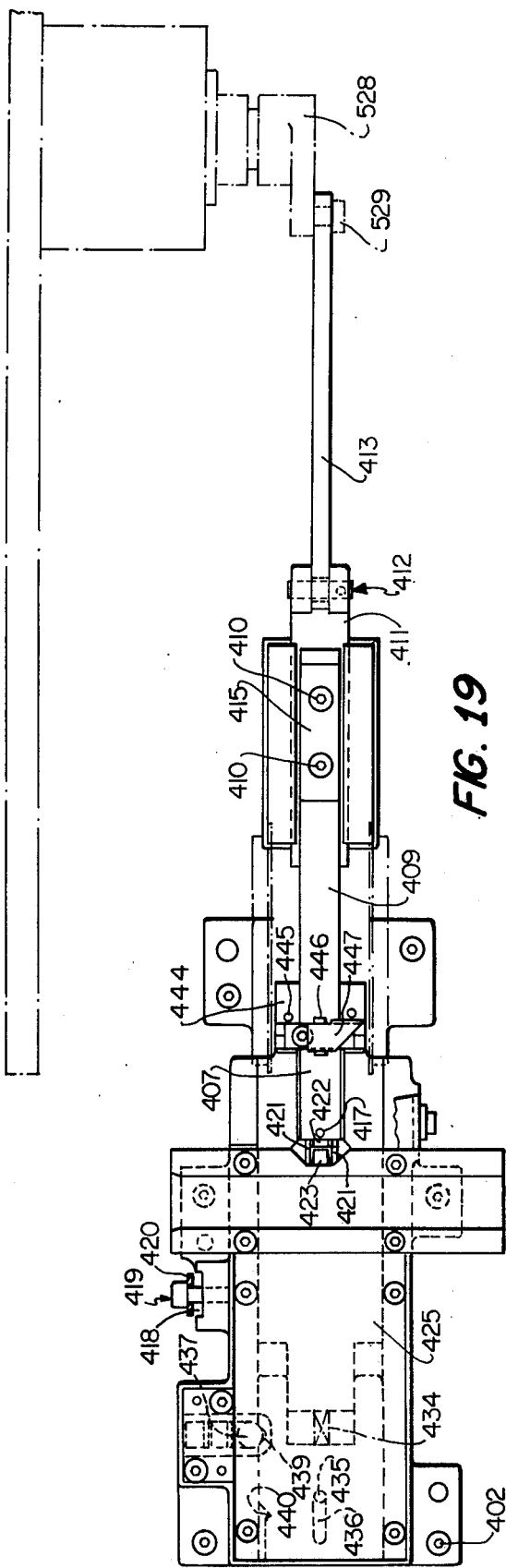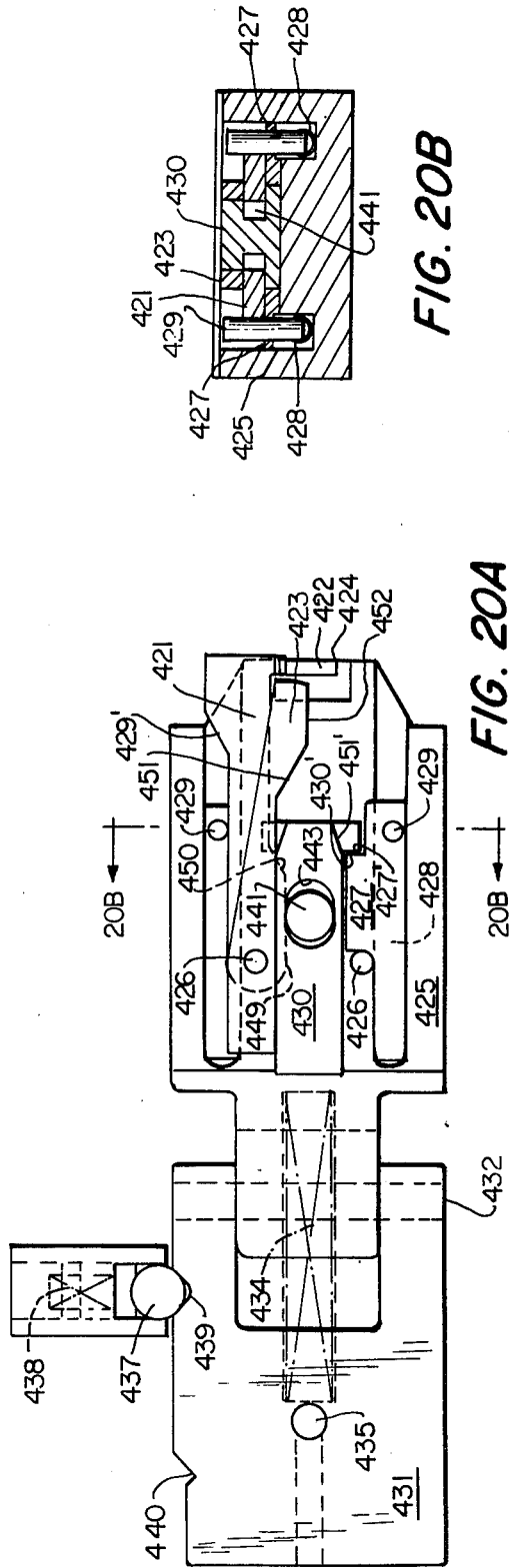

NON-AXIAL LEAD ELECTRICAL COMPONENT PREPPER-TAPER APPARATUS

This is a divisional of application Ser. No. 650,674, filed Jan. 20, 1976, now U.S. Pat. No. 3,987,528.

BACKGROUND OF THE INVENTION

1. Field of the Invention

The present invention relates to an apparatus for taping electronic components, having at least two leads extending from the body thereof in the same direction, in a substantially axial lead configuration between two pairs of continuous ribbons of adhesive tape.

2. Description of the Prior Art

In the field of electronic component insertion devices, there are many machines which will insert components having axial leads. The older machines include a bin storage taking one component at a time and inserting it into a printed circuit board. The newer machines utilize electronic components which are sequenced and taped and then placed on a continuous roll to be fed into the newer insertion machines. By taping components in sequence of order, the machine can proceed without using a plurality of supply stages.

Though there are a large number of machines which will tape, sequence and insert axial lead electrical components, there are very few machines which will tape or sequence or insert electronic components whose leads are not axial. Two major examples of non-axial lead components are transistors and disc capacitors. An example of a machine which will tape transistors for later use and insertion in a machine is U.S. Pat. No. 3,616,089, dated Oct. 26, 1971. This patent is assigned to Universal Instruments Corporation, assignee of the present invention. This patent also exemplifies the processing of loose electrical components from a bin to a sequential tape. Further, a machine which will tape and sequence disc capacitors in their non-axial lead configuration is disclosed in U.S. Pat. No. 3,878,026, dated Apr. 15, 1975, which is also assigned to Universal Instruments Corporation.

Electronic components, for convenience and component handling, are presently being shown in some form of packaging. This form of packaging is generally a manufacturing strip having the components attached thereto, as shown for example, in U.S. Pat. No. 3,135,375. Because of the present state of the art of the electric component shipping and packaging strips, there is a need for a machine which can process the electronic components from the manufacturing strips in a non-axial lead configuration into a taped sequence of components in a substantial axial lead configuration for use in a standard axial lead electronic component insertion device of the prior art.

SUMMARY OF THE INVENTION

The present invention is an apparatus for sequentially feeding non-axial lead electrical components in their manufacturing strips from a magazine to a forming station where they are removed, bent into a substantially axial lead configuration and taped between two continuous ribbons of tape. A magazine, having a plurality of manufacturing strip retainers attached to and rotated by a pair of chains, sequentially present a manufacturing strip to a transport assembly by a pusher.

The transport assembly includes a pair of lower feed blades which rise, advance, lower and return to incrementally advance the manufacturing strips by engaging leads of the electrical component and a pair of upper feed blades which lower to engage the leads. The upper feed blades deliver manufacturing strips to the forming station. The leads are straightened in the manufacturing strip by two pairs of jaws which engage the leads and place them under tension.

The forming station has a tool holder which rotates a pair of grippers and a pair of wipers up into the plane of the electrical component. Drive mechanism closes the grips to secure the leads to the tool holder which moves laterally to remove the electrical component from the manufacturing strip. The wipers, which lies between the parallel leads of the electrical component, rotates out to bend the leads approximately ninety degrees in the opposite direction so as to lie in the same plane.

The component, with its leads in a substantial axial lead configuration, is then taped between two pairs of continuous tapes. A control system permits a common drive assembly to activate the magazine only if another manufacturing strip of electrical components is needed and to activate the taping assembly only if an electrical component is detected at the forming station.

OBJECTS OF THE INVENTION

It is an object of the present invention to provide an apparatus for taping non-axial lead electronic components in a substantially axial lead configuration.

Another object is to provide a single apparatus for removing non-axial lead components from their manufacturing strips, forming them into substantially axial lead components and taping the components between two pairs of continuous ribbons of tape.

A further object is to provide a single apparatus for transporting non-axial lead components in their manufacturing strips, straightening the leads, forming the leads into a substantially axial lead configuration and taping the components between two pairs of continuous ribbons of tape.

Still another object is to provide an apparatus having an assembly for supplying and transporting electrical components in their manufacturing strips.

A still further object is to provide an apparatus having an assembly for straightening electrical components while in their manufacturing strips.

An even further object is to provide an apparatus having a single assembly which removes the non-axial lead component from its manufacturing strip and forms the leads into a substantial axial lead configuration.

Other objects, advantages and novel features of the present invention will become evident from the following detailed description of the invention when considered in conjunction with the accompanying drawings.

BRIEF DESCRIPTION OF THE DRAWINGS

FIG. 7 is a front elevation of the transport assembly;

FIG. 8 is a partial sectional view taken along lines 8—8 of FIG. 3;

FIG. 9 is a partial sectional taken along lines 9—9 of FIG. 7;

FIG. 10 is a partial sectional view taken along lines 10—10 of FIG. 7;

FIG. 19 is a top elevation of the forming station;

FIG. 20A is a top detail of the tool block and holder without the cover for tool holder;

FIG. 20B is a section taken along line BB of FIG. 20A;

DESCRIPTION OF THE PREFERRED EMBODIMENTS

Figure 1:
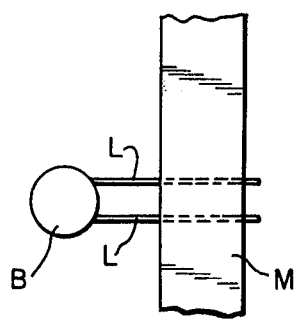
FIG. 1 is a view of the electrical components in a manufacturing strip.
Figure 2:
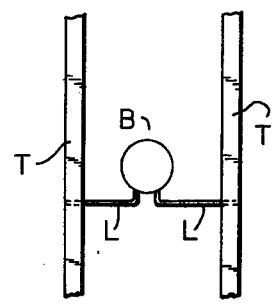
FIG. 2 is a view of the electrical components formed and taped.

The preferred embodiment of the prepper taper of the present invention begins with disc capacitors in their manufacturing strip and ends with disc capacitors taped in a substantial axial lead configuration. The disc capacitor is manufactured having a body portion B with two parallel leads L extending from the body parallel and in the same direction and packaged in a manufacturing strip M as illustrated in FIG. 1. The disc capacitor, after processing by the present apparatus, is illustrated in FIG. 2 having the body B centered between the leads L which are in the same plane between two pairs of continuous tapers T. This configuration is equivalent to, or is substantially, an axial lead component and may be inserted into printed circuit boards by standard or slightly modified insertion devices of the prior art. Although disc capacitors are used as an example of non-axial lead components, the present invention will prepare and tape any electrical component having parallel leads extending from the same side of the body and in a manufacturing strip.

Figure 3:
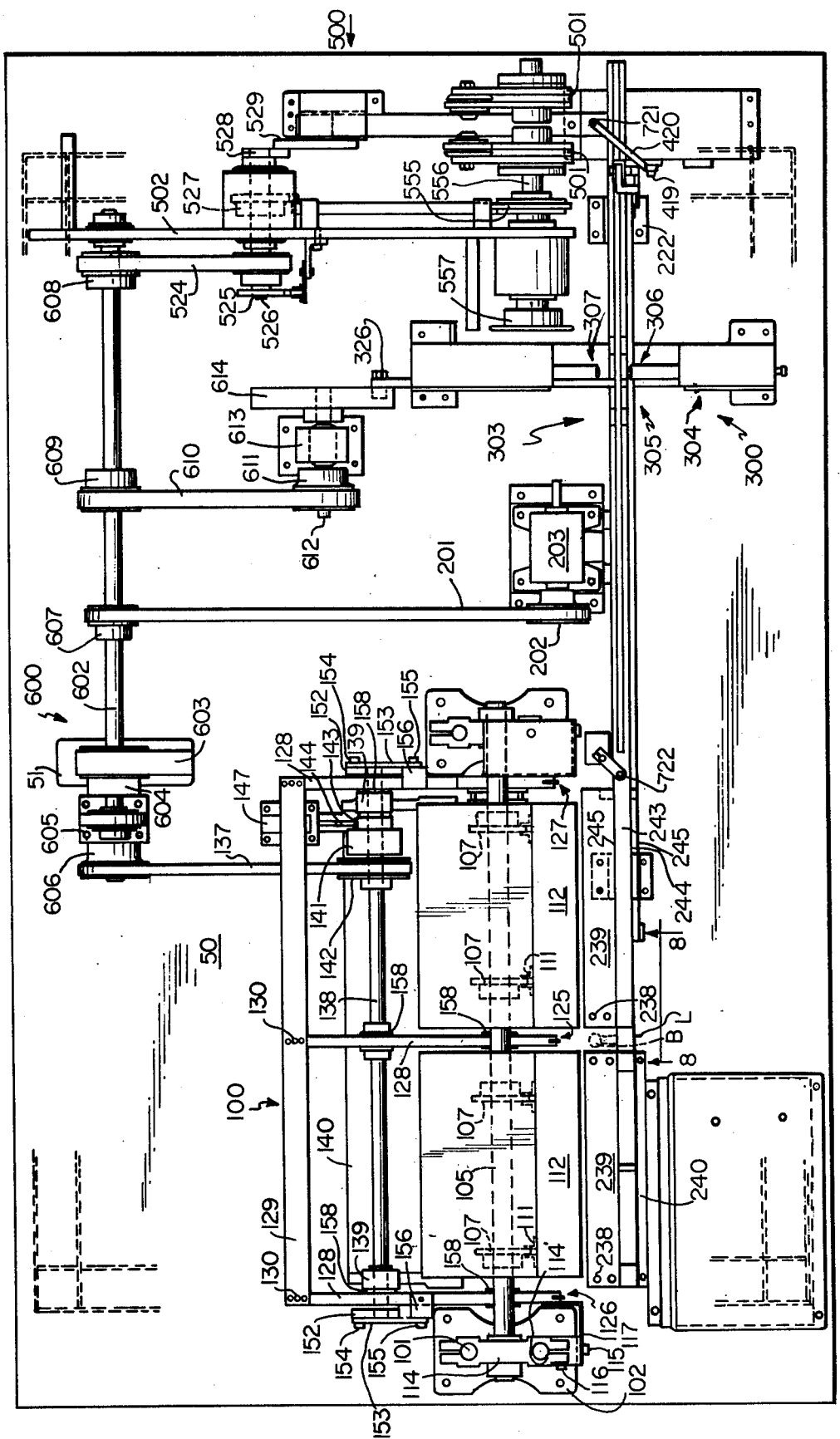
FIG. 3 is a top elevation of a preferred embodiment of the prepper-taper.

As illustrated in FIG. 3, a preferred embodiment of the prepper taper has a magazine assembly 100, a transport assembly 200, a straightening assembly 300, a forming station 400, a taping assembly 500 and a main driving assembly 600 and control system 700. These assemblies are mounted to a tabletop 50 which includes an aperture 51 for connecting the drive motor to the common drive shaft.

A plurality of disc capacitors, in their manufacturing strips, are manually inserted in a revolving magazine of magazine assembly 100 which sequentially presents the disc capacitors in the manufacturing strips to transport assembly 200. The leads of the disc capacitors are straightened while in their manufacturing strip by the straightening assembly 300 and transported to the forming station 400 by transport assembly 200. A sensor detects the trailing edge of the manufacturing strip on the transport assembly and rotates the magazine assembly to present another strip of disc capacitors.

At the forming station 400, a sensor detects the presence of a disc capacitor and removes the disc capacitor from the manufacturing strip. The leads of the disc capacitor are then formed to be aligned in a plane so as to approximate the axial lead electrical component. The formed component is received by the taping assembly 500 where it is joined to two pairs of continuous tapes and wound about a reel for storage or use in an insertion device. A drive assembly 600, in combination with the control system 700, provides the proper sequence of operations of the other assemblies and stations as described.

MAGAZINE ASSEMBLY 100

As illustrated in detail in FIGS. 3–6, the magazine assembly 100 has two pairs of rods 101 at each end of the assembly secured to the table 50 by supports 102 and fasteners 103. A pair of shafts 104 and 105 are mounted between the rods 101 by a bridge 106 which includes a bearing surface. Spaced along each shaft 104 and 105 are four sprocket wheels 107 which receive and drive four roller chains 108. Around each rod 101 is a spring 109 which biases the bridges 106 apart so as to keep the roller chains 108 under tension.

The roller chains 108 include a plurality of links 110 and brackets 111 attached to each other by rivets. Mounted to the face of brackets 111 and extending across the magazine assembly 100 parallel to shafts 104 are a plurality of U-shaped retainers 112, each having a pair of plates. The disc capacitors in their manufacturing strips are manually inserted into retainer 112 with the body of the capacitor towards the rear to be sequentially presented to the transport assembly 200.

Figure 5:
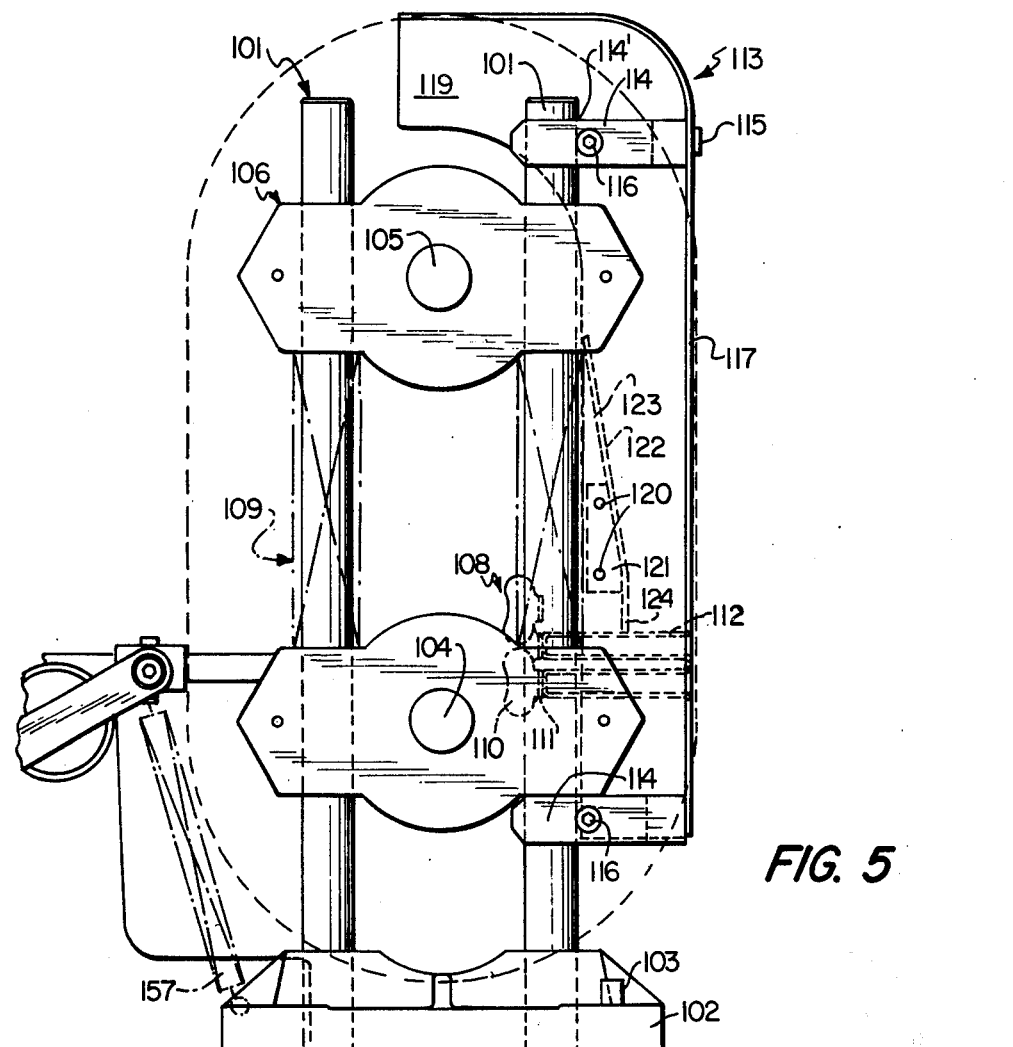
FIG. 5 is a left side elevation of the magazine assembly.

A right and left guide 113 are mounted to rods 101 by supports 114 and fasteners 115. The supports 114 have an aperture 114' to receive rod 101 and a fastener 116 which, when tightened, reduces the size of aperture 114' and securely mounts support 114 to the rod. Fastener 115 connects face 117 of guide 113 to support 114 through elongated openings 118 which allow for adjustment of the guide 113. Face 119 of guide 113 provides a guide surface and has cam guide 122 mounted thereto by appropriate fasteners 120 through a plate 121 as illustrated in FIG. 5. Cam guide 122 has an inclined surface 123 ending in a vertical surface 124 which coacts with the rear edge of the disc capacitors manufacturing strip to move it forwards as the strips are rotated down. By using cam guide 122, the location or alignment of the manufacturing strips is assured relative to the pusher mechanism irrespective of the depth of the manufacturing strip in retainer 112 produced by manual insertion.

The pusher mechanism which moves the manufacturing strips from the revolving magazine assembly 100 to the transport assembly 200 has three pusher elements, one in the middle 125 and one adjacent each end of the manufacturing strips 126 and 127 (see FIG. 3). Although three pusher elements are illustrated, the center pusher element may be eliminated if the manufacturing strips are rigid enough to support the weight of the disc capacitors without bowing. The pusher elements each include a pusher bar 128 joined at one end to a common bar 129 by fasteners 130 and a pusher 131 is pivotally mounted in a U-shaped recess 132 to the other end by pin 133.

Figure 6:
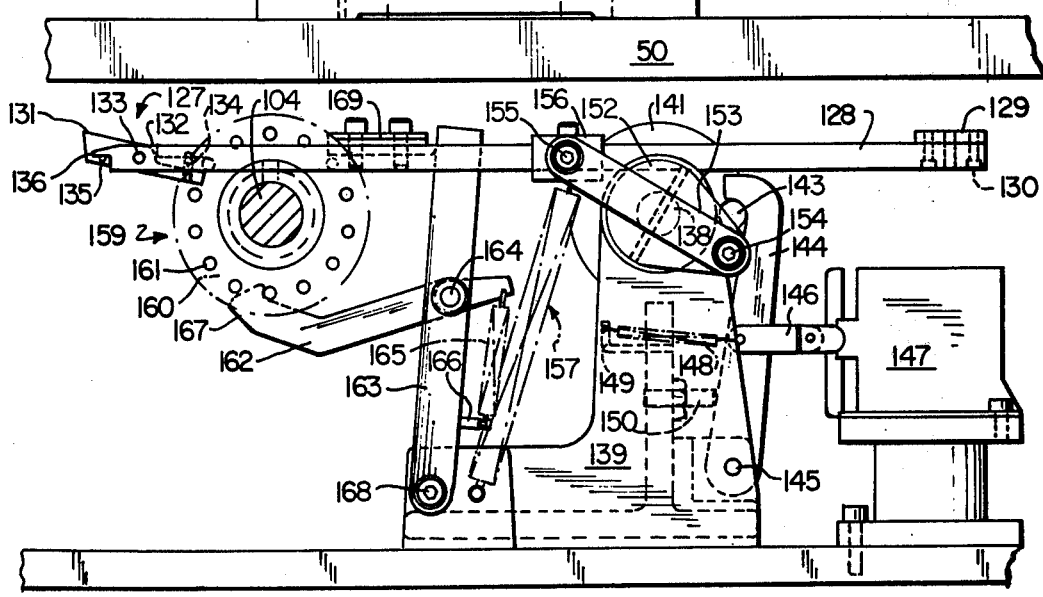
FIG. 6 is a right side elevation of the drive and pusher mechanism of the magazine assembly.

A spring 134 mounted in recess in pusher bar 128 and pusher 131 biases dowel 135 of pusher 131 into contact with lower surface 136 of pusher bar 128 as shown in FIG. 6. As will be explained more fully in the operative explanation of the magazine assembly, the spring 134 maintains pusher 131 up in the push position during the forward push stroke and allows the pusher 131 to rotate down during the retract or return stroke below the body of the disc capacitor of the next manufacturing strip which has been simultaneously rotated into alignment with the pusher mechanism for being pushed during the next stroke. This ability to lower the pusher 131 during the return stroke is especially advantageous for the middle pusher element 125 since a disc capacitor is very likely to be in the center of the manufacturing strip and the end pusher elements 126 and 127 are aligned to push adjacent ends of the manufacturing strip where no disc capacitors are packaged.

The drive mechanism for the magazine assembly, including the pusher mechanism, is connected to the main driving assembly 600 by belt 137 as shown in FIG. 3. A drive shaft 138 is journalled adjacent its ends to supports 139 which are secured to the table 50 by fasteners through support base plate 140. Mounted on drive shaft 138 is a slip clutch 141 whose input is driven by belt 137 through sprocket 142. A key 143 mounted to the output side of slip clutch 141 is prevented from rotating by stop dog 144 which is pivotally mounted to support 139 by pin 145. A clevis 146 interconnects a solenoid 147 and stop dog 144. A spring 148 connected between stop dog 144 and spring post 149 returns the stop dog 144 to the catch position against stop 150 after solenoid 147 retracts stop dog 144 to release key 143 and clutch 141.

Mounted at each end of drive shaft 138 is a crank 152 having a link 153 eccentrically counted by pin 154. The other end of link 153 is pivotally mounted to a respective pusher bar 128 of pusher elements 126,127 by pin 155 in a bracket 156. The crank 152 through link 153 drives pusher elements 126 and 127 for one revolution of shaft 138 to produce a one cycle pitman effect. The center pusher element 125 is driven by bar 129 connecting it to pusher elements 126 and 127.

A spring 157 connected between pusher bar 128 and support 139 pulls pusher bar 128 down so that the rotary motion of crank 152 is translated to linear reciprocal motion of the pusher bar 128. Collars 158 are mounted on drive shaft 138 and chain shaft 104 to act as guides and prevent lateral motion of pusher bars 128. The collar also acts as the surface against which springs 157 bias the pusher bars 128.

The roller chains 108 are advanced one retainer thickness or feed station through an index wheel 159 mounted on pusher element 127 end of shaft 104. The index wheel 159 includes two parallel discs 160 having a plurality of dowels 161 therebetween. Positioned between disc 160 is dog 162 which is pivotally mounted at 164 to an actuator bar 163. A spring 165 connected between a spring post 166 (which is mounted to actuator bar 163) and dog 162 to urge the leading end 167 up into engagement with the dowels 161. The actuator bar 163 is pivotally mounted to support 139 at 168 at one end and moves in contact with stop 169 mounted to pusher bar 128 of pusher element 127 at the other end. Actuator bar 163 follows stop 169 because of the tension of spring 165. As a back-up, a post (not shown) is mounted to bracket 156 to drive actuator bar 163 forward.

The operation of the magazine assembly 100 begins with a signal from control signal 700 which has determined that another manufacturing strip of disc capacitors is needed. This signal activates solenoid 147 which pulls stop dog 144 to release key 143, allowing shaft 138 to be driven by main driving assembly 600 through belt 137. Rotation of shaft 138 causes crank 152 to move pusher bar 128 forward dispensing a manufacturing strip of disc capacitors to transport assembly 200. The forward movement of pusher element 127 removes stop 169 from actuator bar 163, which is free to pivot forward. By the forward movement of actuator bar 163, forward end 167 of dog 162 moves out of engagement of one of dowels 161 and past the next dowel 161. Upon the return stroke of pusher element 126, stop 169 forces actuator bar 163 to pivot in the opposite direction and bring end 167 of dog 162 into contact with the next dowel 161. At the end of the return stroke of pusher element 127, dog 162 has rotated index wheel sufficiently to advance chain 108 one feed position. Shaft 138 is limited to one evolution by stop dog 144 catching key 143.

TRANSPORT ASSEMBLY 200

Figure 11:
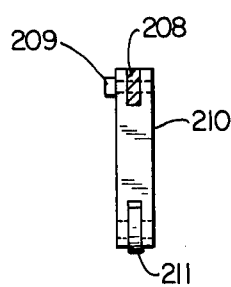
FIG. 11 is a partial sectional view taken along lines 11—11 of FIG. 7.
Figure 12:
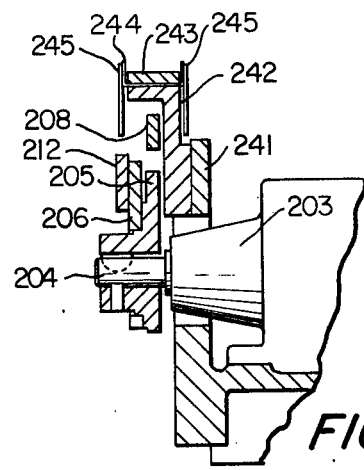
FIG. 12 is a partial sectional view taken along lines 12—12 of FIG. 7.
Figure 13:
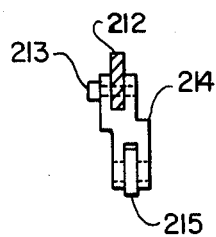
FIG. 13 is a partial sectional view taken along lines 13—13 of FIG. 7.

The transport assembly is connected to the main driving assembly 600 by belts 201 through sprocket 202 and bevel gear box 203. Mounted to the output shaft 204 of gear box 203 is a feed cam 205 which has a lift cam 206 mounted thereon by fasteners 207 as shown in FIGS. 7 and 12. A feed bar 208 has mounted thereto, by fasteners 209, a bracket 210 with a ball bearing 211 as shown in FIG. 11. The ball bearing 211 rides on a feed cam 205. A lift bar 212 has mounted thereto by fasteners 213 a bracket 214 with a ball bearing 215 as shown in FIG. 13. Bracket 214 offsets lift bar 212 and ball bearing 215, the latter of which rides on lift cam 206. The cams 205 and 206 are shaped so as to produce a cycle of motion having the sequence: up, forward, down, return for each revolution of output shaft 204.

Figure 14:
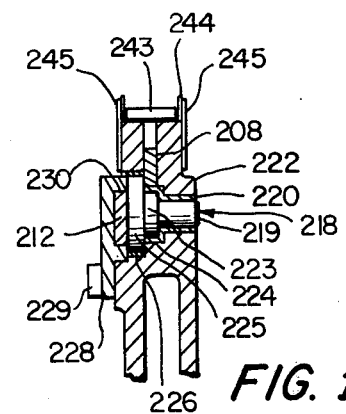
FIG. 14 is a partial sectional view taken along lines 14—14 of FIG. 7.
Figure 15A:
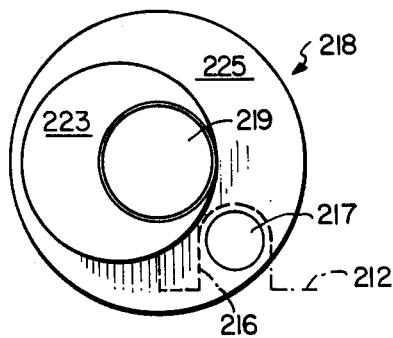
FIGS. 15A and 15B are front and right elevations of the eccentric elements of FIGS. 10 and 14.
Figure 15B:
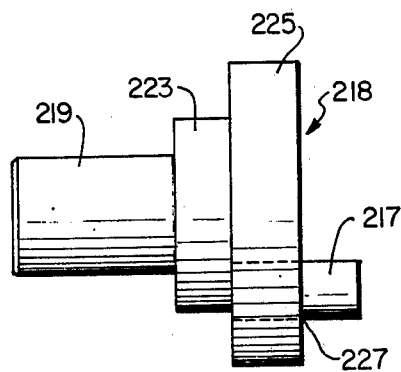

Adjacent each end of lift bar 212 is a slot 216, shown in phantom in FIG. 15A for receiving a pin 217 mounted to an eccentric element 218. Cylindrical section 219 of concentric circle 218 is attached with bearing 220 to support 221 of FIGS. 7 and 10 and support 222 of FIGS. 7 and 14. An eccentrically located cylindrical section 223 of eccentric 218 includes an exterior bearing 224 upon which rides feed bar 208. A third cylindrical section 225 of eccentric element 218 has an exterior bearing 226 and an aperture 227 to receive pin 217. Brackets 228, which are secured to supports 221 and 222 by fasteners 229, have a recess 230 to receive the ends of lift bar 212 and restrict their motion to the horizontal plane.

Rotation of lift cam 206 is translated to horizontal (forward and return) movement of lift bar 212 through bracket 214. The horizontal movement of lift bar 212 is translated to rotary movement of eccentric element 218 through slot 216 and pin 217. The rotary movement of eccentric element 218 is translated to a vertical (up and down) movement of feed bar 208 by eccentric cylindrical section 223. The horizontal movement of feed bar 208 is produced by rotation of feed cam 205. Spring 231 connected to spring posts 232 between lift bar 212 and support 221 urges the lift bar 212 to return to its home position. Springs 233 connected to spring posts 234 between the feed bar 208 and the table 52 urge feed bar 208 to its down position. Spring 235, as shown in FIG. 8, is connected between recess 236 in support 221 and bracket 237 on feed bar 208 to urge feed bar 208 to its return or home position.

Mounted to the top of support 221 by fasteners 238 are a pair of rear plates 239 adjacent retainers 112 and a front plate 240. The disc capacitors in their manufacturing strip are presented to the plate 239 and 240 by the magazine assembly 100 so that the bodies B of the disc capacitors rest on rear plates 239 and the manufacturing strip lies between left plate 239 and plate 240, as shown in FIG. 3. Mounted to support 221 adjacent the right rear plate 239, to gear box support 241 (by bracket 242 - See FIG. 12) and to support 222 by fasteners is a bar 243 to which is mounted a U-shaped guide 244 (See FIGS. 8, 9, 10, 12 and 14). The manufacturing strips lie within the guide 244 as they are transported.

Feed blades 245 are mounted to spacer block 246 by fasteners 247 which are connected to feed bar 208 as shown in FIG. 9. The feed blades 245 are adjacent the exterior of guide 244 and have an upper serrated edge 248 which is below the top edge of guide 244 when feed bar 208 is in its down position. Feed blades 245 follow the cycle of feed bar 208 to rise between lead portions of the disc capacitor on each side of the manufacturing strip, push the leads one-component distance forward, lower below the leads and return to the home position. Though the serrated edge may contact each lead, it has been found sufficient to separate the serrated edges so that they contact only every third lead. This spacing does not seriously reduce the integrity of the transport assembly since a feed can be accomplished even if up to ten disc capacitors are missing from a single manufacturing strip.

Guide 244 and feed blades 245 feed the disc capacitors from the magazine assembly 100, past the straightening assembly 300 and terminates adjacent the forming station 400 because the access from below the disc capacitors is required for the forming station 400. To feed the disc capacitors from guide 244 to the forming station, a pair of feeding blades 249 are mounted on one end of an attachment element 250 above the disc capacitors. The other end of attachment element 250 is pivotally connected at 251 to feed blades 245. A stationary bracket 252 has an elongated opening 253 which receives dowel 254 attached to attachment element 250.

When feed blades 245 are raised, blades 249 are lowered by attachment element 250 pivoting about dowel 254. When feed blades 245 are moved forward or return, dowel 254 rides the length of opening 253. When feed blade 245 is lowered, blades 249 are raised by attachment element 250 pivoting about dowel 254.

STRAIGHTENING ASSEMBLY 300

The disc capacitors in their manufacturing strip have their leads straightened by straightening assembly 300 between the magazine assembly 100 and the forming station 400. The straightening assembly 300 has a support 301 secured to the table 50 by fasteners 302 and include a front porton 304 and a rear portion 303 separated by a reduced height middle portion 305. The rails and feed blades (shown in phantom in FIG. 16) of transport assembly 200 traverse the support 301 over middle portion 305.

Two pairs of jaws 306 and 307 close to grasp the pair of disc capacitor leads on each side of the manufacturing strip. Rear jaw 307 moves relative to front jaw 306 to place the leads under tension to straighten them. Jaws 306 and 307 have a pair of pivot plates 308 and 309 between which are pivotally mounted by a pin 310 a pair of jaw members 311. A pin 312 mounted to an extended member 314 of actuator 315 rides along surface 313 of the jaw members 311. Surface 340 of the actuator extender member 314 coacts with surface 341 of jaw members 311. Mounted by fastener 327 in a slot 328 in the face of each jaw 311 is a plate 329 having a pair of V-shaped grooves to grip the component leads. The plates 329 intersect the component leads at an inward angle.

A biasing means 342, shown as a spring, is received in the jaw 311 to bias the top of the plate so as to increase the inwardness of the component lead engaging end of plates 329. As will be explained more fully below, the inward slant of the plates causes a toggle action which increases the gripping action of the jaws. These plates 329 are replaceable for different lead diamerets and spacing.

A channel 316 is provided in pivot plate 308 to permit horizontal motion of actuator 315. A spring 317 lies in a channel 318 in actuator 315 between the rear of channel 318 and a post 319 extending from pivot plate 309. The spring 317 urges the actuator 315 away from the jaws so that the jaws are closed by pin 312 riding along surface 313 and forcing the jaws 311 together. When actuator 315 is moved towards the jaws, pin 312 moves out of engagement with surface 313 and surface 340 of the actuator coacts with surface 341 of the jaws to cause the jaws to open.

A push rod 320 applies the forward force on actuator 315 of forward jaw 306 through interposer 321 pivotally mounted to support section 304 at 322. Interposer 321 is pushed at one end and pushes a post 323 extending from actuator 315 with its other end. An adjustable stop 324 extends from support section 304 to limit the spring urged rearward movement of actuator 315. A cam plate 325 mounted to an extended portion of push rod 320 provides the forward force through post 323 to actuator 315 of jaws 307. A cam follower 326 is pivotally mounted to push rod 320 and coacts with a cam plate in the main drive assembly 600 to process the required motion at the proper time.

The elements of jaws 307 are same as those for jaw 306 except for pivot plate 309 and the elements needed to move jaw 307 back and forth to place the leads of the disc capacitor under tension. Pivot plate 309 of rear jaw 307 slides in a channel 330 of rear support portion 303. A pair of springs 331 each lie in a slot 332 between the rear of the slot and a pin 333 mounted to the support portion 303 and urge pivot plate back towards the rear of the support. A pin 334 extending from pivot plate 309 coacts with cam plate 325 of push rod 320 to move pivot plate 309 forward to extend jaw 307.

A cam 335 rotates about a shaft 336 which is mounted to rear support portion 303. Attached to cam 335 is a cam follower 337 and a spring 338 which is coiled around shaft 336 and connected at its other end to support portion 303. Adjustable stop 324 (which is longer than stop 324 of front jaw 306) extends through shaft 336 and a block 339 mounted to pivot plate 309 by fastener 340. Block 339 assures that stop 324 will not rotate. Cam 335 coacts with the rear of pivot plate 309, cam follower 337 with the cam plate 325 and stop 324 with the rear of actuator 315.

Figure 16:
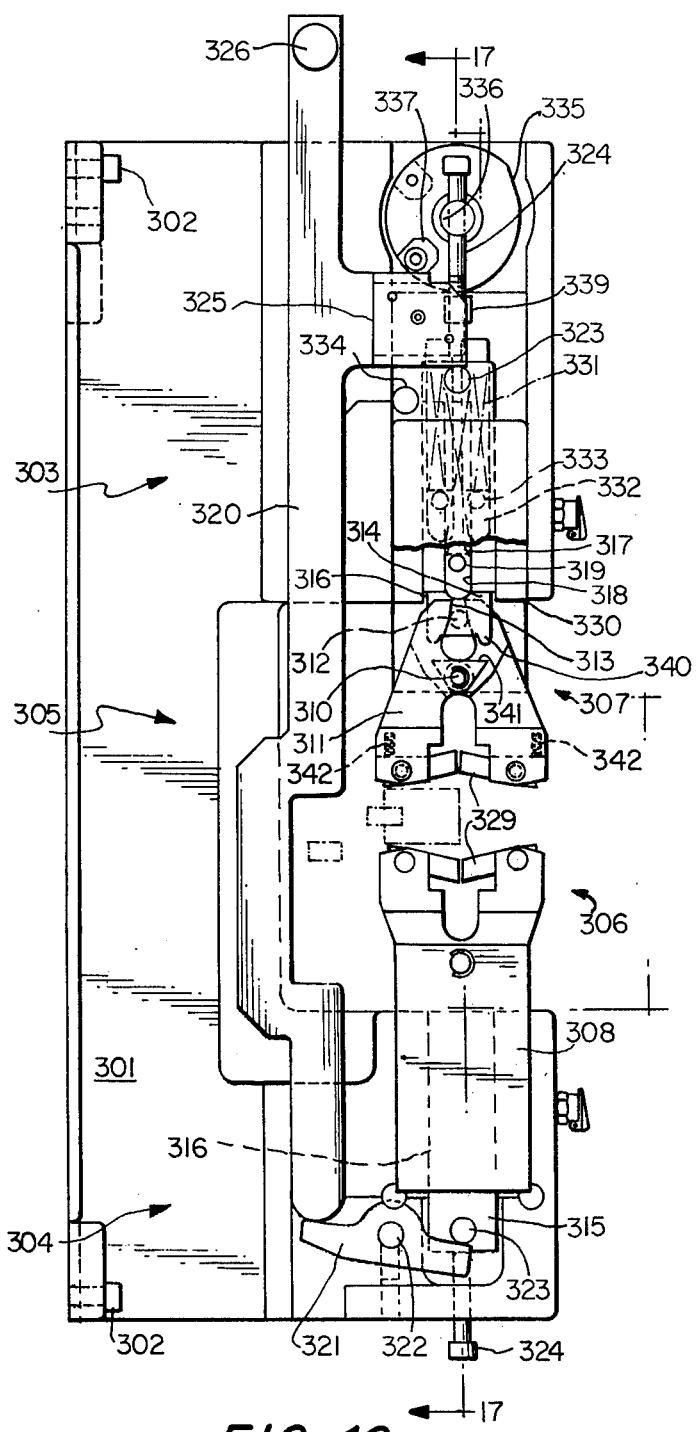
FIG. 16 is a left side elevation of the straightening assembly of the present invention.
Figure 17:
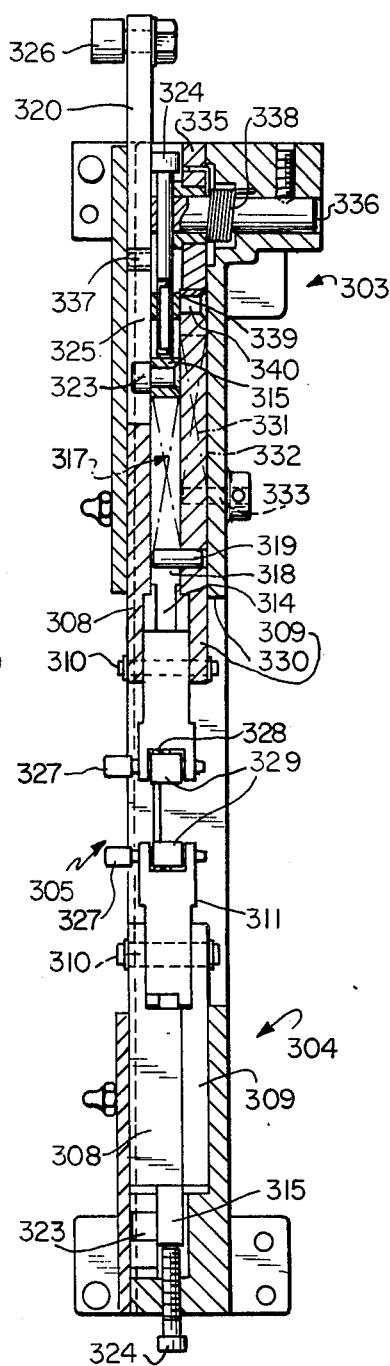
FIG. 17 is a top sectional view taken along lines 17—17 of FIG. 16.

The cycle, for purposes of explanation, of straightening assembly 300 begins with push rod 320 moving down in FIG. 16. This movement of cam plate 325 to the position shown in FIGS. 16 and 17 allows cam follower 337 to rotate cam 336 counterclockwise under the urging of coil spring 338 from the phantom position shown. The front edge of cam plate 325 and interposer 321 engage their respective posts 323. Continued movement of push rod 320 causes actuators 315 to open jaws 306 and 307 by surface 340 coacting with surface 341. Also, when the front edge of cam plate 325 engages pin 334, it moves pivot plate 309 forward to extend jaw 307.

As the push bar moves back to the top of FIG. 16, posts 323 are disengaged, allowing springs 317 to force the actuators 315 back. This closes jaws 306 and 307 into a positive grip engagement with the leads of the disc capacitor by pin 312 coacting with surfaces 313. During the closing of jaw 307, cam 335 prevents rear pivot plate 309 from moving back away from the component. After the jaws are closed and for the remainder of the return movement of push rod 320, the back edge of cam 325 causes cam follower 337 to rotate cam 325 clockwise against coil spring 338. The rotation of cam 335 allows pivot plate 309 to move back under the urging of springs 331 to place the lead of the disc capacitor under tension to straighten them. A slight relative motion between the component leads and the jaws 311 causes plate 329 to pivot by a toggle motion and thereby increase the gripping engagement.

If the leads are straight before the straightening operation, pivot plate 309 will move back only a very small amount. If the leads are bent, pivot plate 309 will move back a substantial distance. The cycle repeats itself, moving push bar 320 to opening jaws 306 and 307 to release the straightened lead disc capacitor, and extend jaw 307 to receive a new disc capacitor.

FORMING STATION 400

Figure 18:
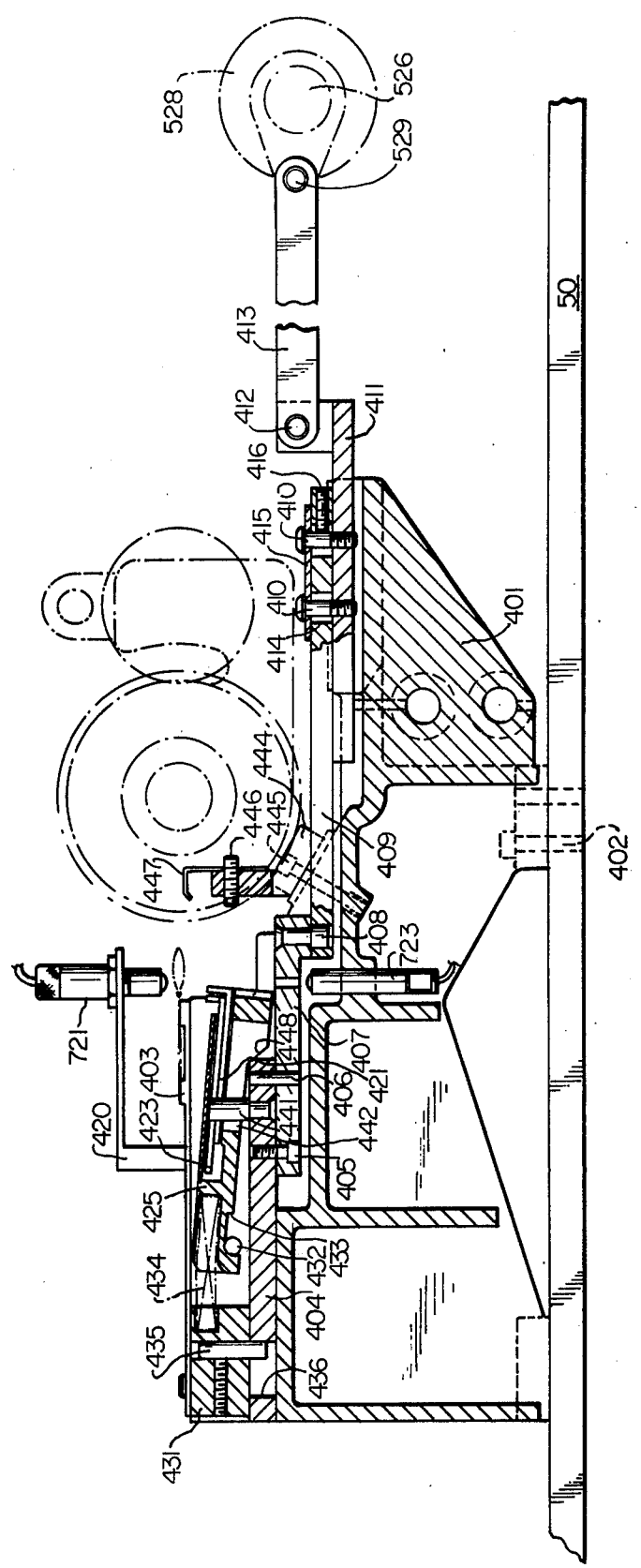
FIG. 18 is a right side elevation of the forming station of the present invention.

As illustrated in FIGS. 18–20, the forming station 400 has a support 401 secured to table 50 by fasteners 402. Mounted to the top of support 401. In alignment with guide 244 of the transport assembly 200 is a U-shaped guide 403 which receives the manufacturing strip within its sides.

A driver plate 404 is connected to pin 529 of the taping assembly drive via fastener 405 and pin 406 to bar 407, fastener 408 between bar 407 and drive bar 409, fastener 410 between drive bar 409 and drive adjust bar 411, and pin 412 between drive adjust bar 411 and link 413 which receives pin 529. Elongated apertures 414 and retainer plates 415 are provided in drive bar 409 to receive fasteners 410 so that drive bar 409 may be adjusted relative to drive adjust bar 411 and retained at said adjusted position by adjustable stop 416. An opening 417 is provided in bar 407 for direct communication between light source 721 and sensor 723 of the control system 700. A slot 418 and fastener 419 (FIG. 19) are provided to mount a bracket 420 for light source 721 to support 400.

The tooling which removes the disc capacitor from the manufacturing strip and bends the leads to be in a single plane is shown in FIGS. 20A and 20B to include a pair of grippers 421, a gripper block 422 and a pair of wipers 423. For clarity of illustration, only one gripper 421 and one wiper 423 are shown in FIG. 20A. Gripper block 422 is mounted in a recess 424 of tool holder 425 by a fastener. Grippers 421 and wipers 423 are pivotally mounted to tool holder 425 by pins 426. A pair of spring plates 427 are urged forward by a pair of springs 428, which lie in a pair of channels in the base of the tool holder 425. The springs 428 each push on a roller 429 which extends above and below spring plates 427. As will be explained more fully below, the rollers 429 operate on the outer exterior surface of grippers 421 to cause them to clamp the leads of a component against gripper block 422. A cam 430, having an I-shaped cross-section, controls the position of the spring plates 427 by surface 430 engaging surface 427.

Tool holder 425 is pivotally mounted to tool block 431 by dowel 432 in recess 433 of tool holder 425. Tool holder 425 is urged away from tool block 431 by spring 434. A post 435 is mounted to tool block 431 and rides in an elongated slot 436 in drive plate 404. A detent 437 having a spring 438 is urged into recess 439 and 440 of tool block 431. A trip pin 441 is mounted to drive plate 404 and is received in a bottom slot 442 of tool holder 425 and aperture 443 of the cam 430.

A bracket 444 is mounted to support 401 by fasteners 445. An adjustable stop 446 extends from bracket 444. A component body support 447 is mounted to bracket 444.

The operation of forming station 400 begins with the rightward movement, in FIGS. 18–20, of the forming drive subassembly 404–413. The leading edge of drive plate 404 rides along surface 448 of tool holder 425 to rotate tool holder 425 up to a horizontal position about dowel 432 to place grippers 421 and wipers 423 in the plane of the electrical component. During this first stage of rightward movement, trip pin 441 rides along surface 449 of grippers 421 to open the grippers. After the tool holder is horizontal, the leads of the disc capacitor lie between gripper block 422 and grippers 421, trip pin 441 rides down surface 450 of grippers 421, allowing the grippers to clamp the leads to gripper block 422. The clamping action is produced by rollers 429 riding along surface 429' of the grippers 421.

After the leads are clamped, the rear edge of slot 436 in drive plate 404 engages post 435 to drive tool block and tool holder forward, over riding detent 437. During this second stage of forward movement, trip pin 441 is stationary relative to the tooling since drive plate 404 and tool block and holder 431, 435 move together. The second stage removes the leads of the component from the manufacturing strip and ends when the forward end of tool holder 425 meets stop 446.

Once the tool holder 425 is stopped, the continued forward movement of drive plate 404 causes cam surface 451' of cam 430, via trip pin 441, to ride along surfaces 451 and 452 of wipers 423 to force them apart, thereby causing the leads of the disc capacitor to be bent in the opposite direction 90° relative to their original position. It should be noted that during the forward movement of trip pin 441, the springs 428 having keep surface 427' of the spring plates 427 in contact with surface 430' of cam 430 whose position is determined by trip pin 441. Also, during this third stage of the forward movement, tool block 431 continues forward to close the gap between the tool block 431 and tool holder 425. At this point, the component body rests on support 447 and the substantially axial leads are ready to be received by the taping assembly 500.

The return or leftward movement of drive plate 404 moves trip pin 441, spring plates 427 and cam 430 relative to the tool holder 425 allowing rollers 429 to cam the wipers to return to their center position and allowing trip pin 441 to cam grippers to unclamp the leads. Tool block 431 moves leftward driven by spring 434 until stopped by detent 437 in recess 440. As drive plate 404 continues its leftward movement, tool holder 425 is allowed to rotate around dowel 432 down below the disc capacitor leads. Further leftward movement causes the front edge of slot 436 to engage post 435 and to drive tool block 431 leftward, over riding detent 437, to its home position. This ends the forming station 400's cycle.

The tooling, including grippers 421 and gripper plate 422, are removable to permit replacement for different lead diameters and lead spacing.

TAPING ASSEMBLY 500

The disc capacitors being formed into a substantially axial lead component are presented to a pair of pitch wheels 501 of the taping assembly. Since the taping assembly is an adaptation of the taping assemblies of U.S. Pats. No. 3,421,284 and 3,616,089, it will not be described in detail except for a functional description as it relates to the sequence of operation of the prep-pertaper of the present invention. Said patents, being commonly assigned to the assignee of the present invention, are incorporated herein by reference.

Figure 21:
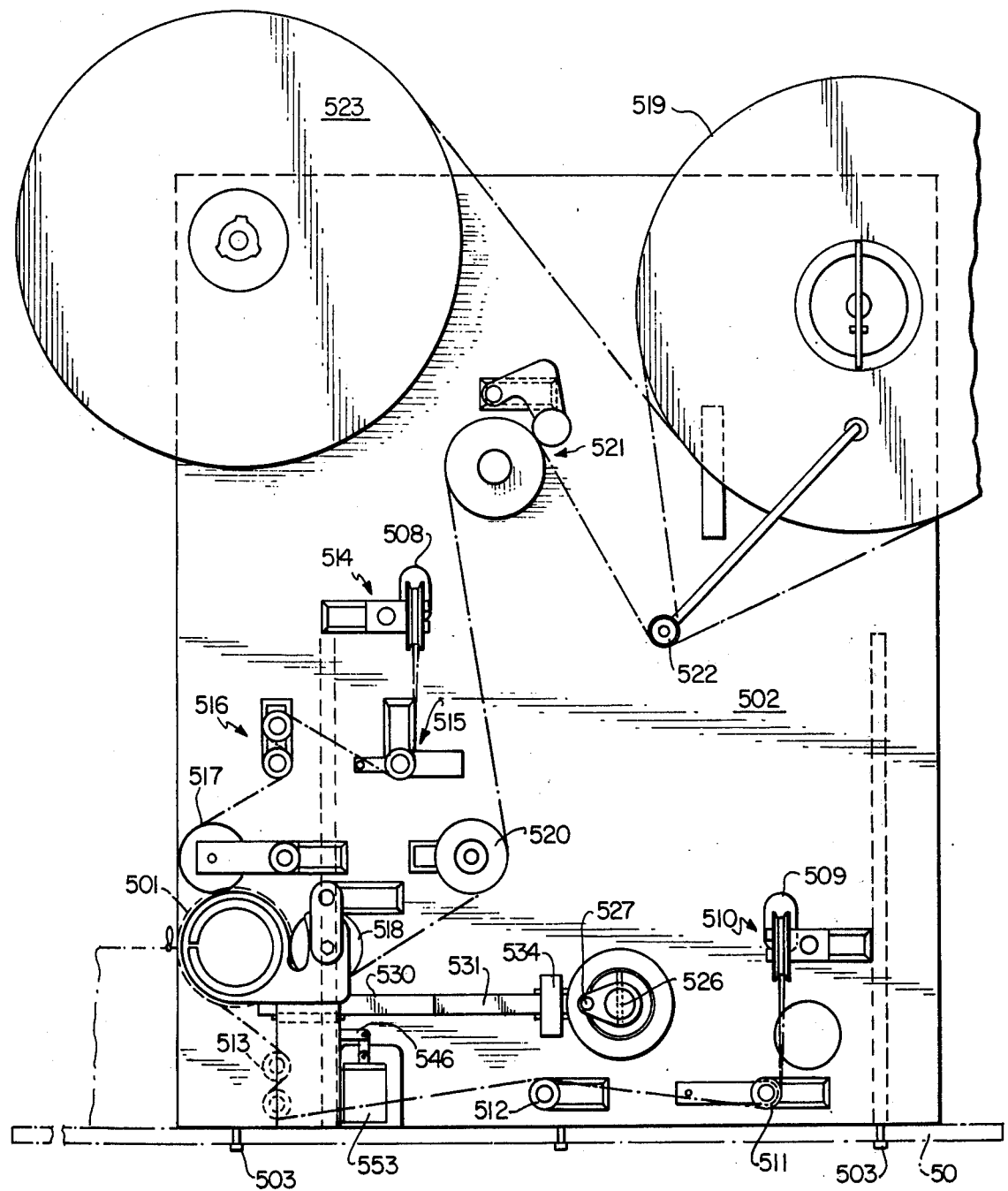
FIG. 21 is a right side elevation of the taping assembly of the present invention.
Figure 22:
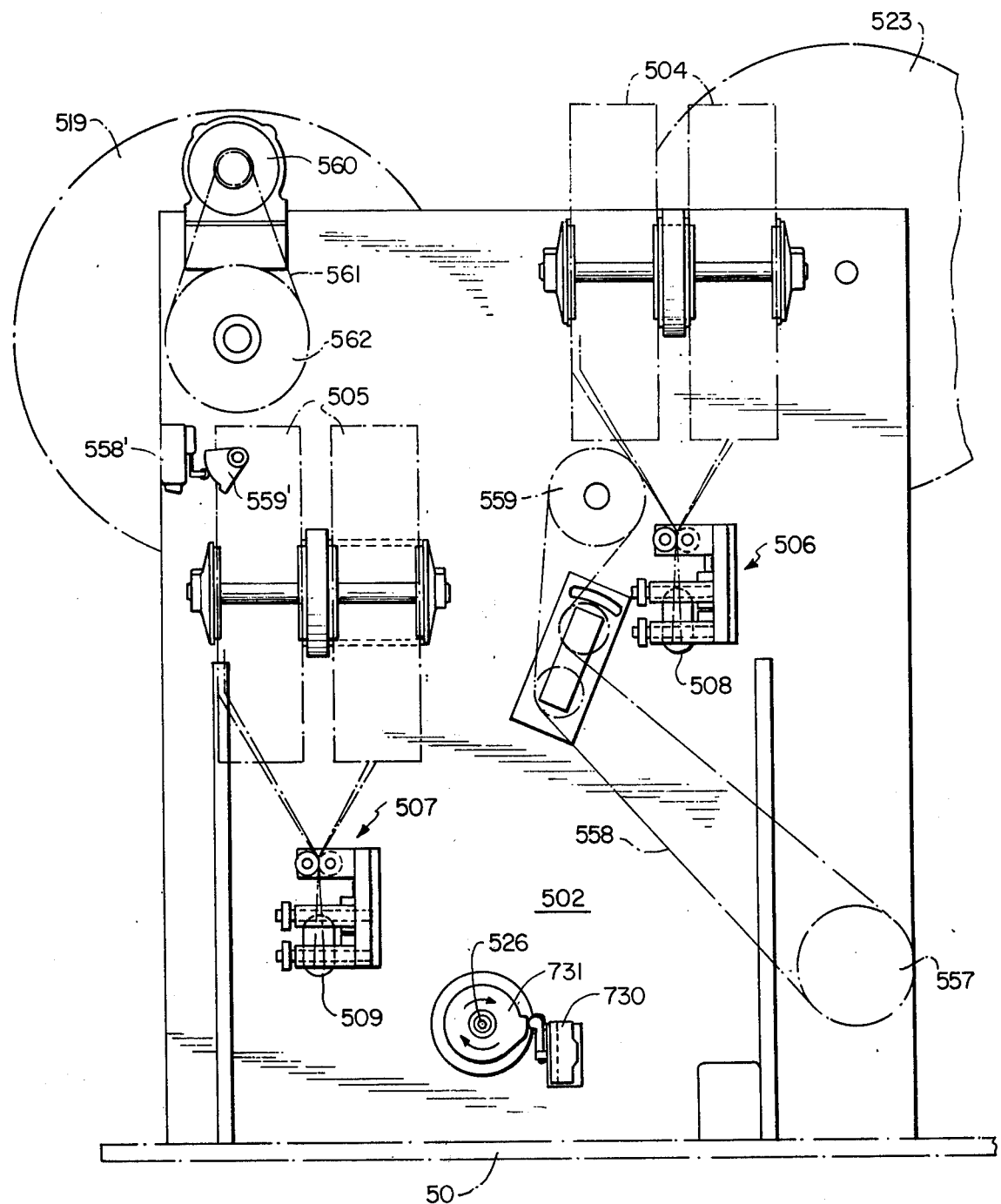
FIG. 22 is a left side elevation of the taping assembly.

Most of the components of the taping assembly 500 are mounted to support plate 502 which is secured to table 50 by fasteners 503. As shown in FIG. 22, tape from spools 504 and 505 are fed via rollers 506 and 507 through apertures 508 and 509 in support plate 502, respectively, to the taping side of the assembly. The tapes from spools 505 are fed to the pitch wheels 501 via aperture 509 and rollers 510–513 to be the bottom tape (See FIG. 21). The tapes from spools 504 are fed to the pitch wheels 501 via aperture 508 and rollers 514–517 to be the top tape. The formed component, as shown in FIG. 21, is presented to the pitch wheel and the bottom tapes 505 and are incremented around to be pressed into contact with the top tapes 504 under roller 517. A pair of rollers and cutter combination 518 severs the portion of the leads outside the two continuous tapes and feeds the taped components to take-up reel 519 via rollers 520–522. An interliner is fed from spool 523 to take-up reel 519.

The taping assembly 500 is driven by the main driving assembly 600 through belt 524 and sprocket 525, which is mounted to shaft 526. A taping cam 527 and forming cam 528 are mounted to shaft 526 on the other side of support plate 502. A pin 529 connects drive link 413 of the forming station 400 to forming cam 528.

Figure 23:
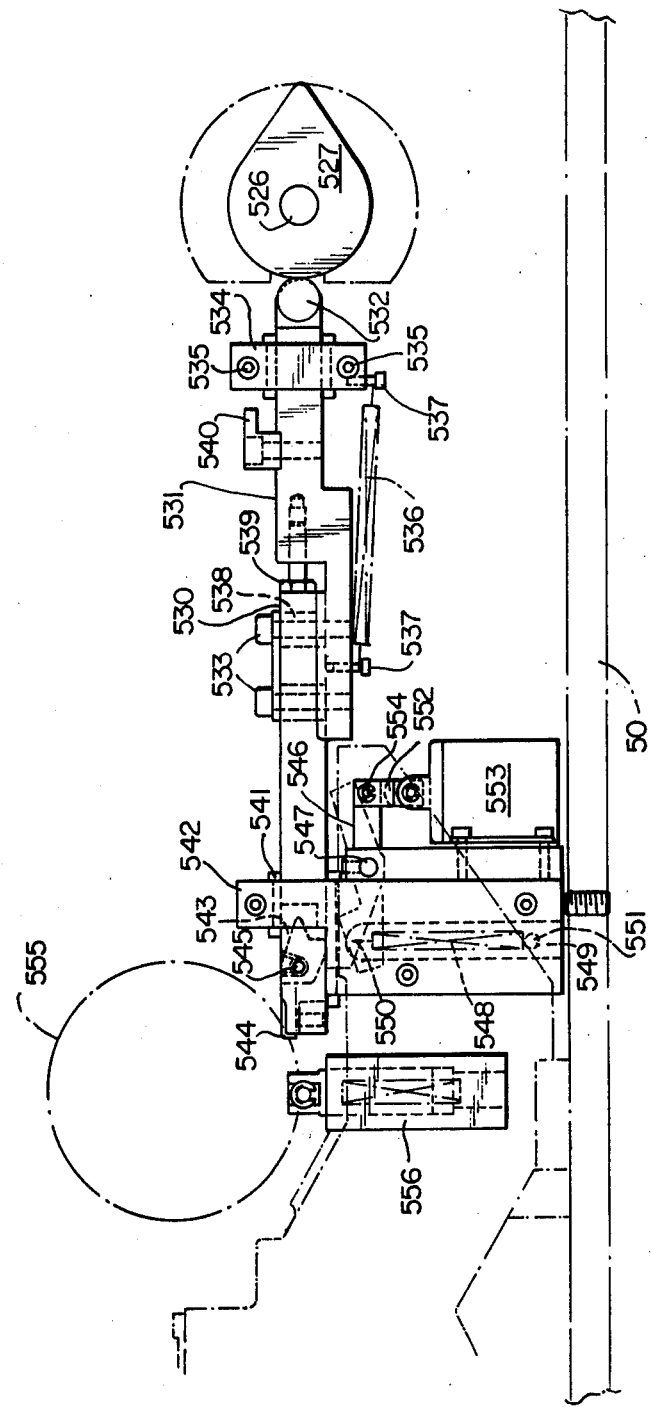
FIG. 23 is a detailed right side elevation of the drive of the taping assembly.

Taping cam 527 drives drive rod 530 by adapter 531, cam follower 532 and fasteners 533, as illustrated in FIG. 23. The adapter 531 slides within bracket 534 mounted to support plate 502 by fasteners 535 and is biased toward taping cam 527 by spring 536 mounted between the adapter 531 and bracket 534 by spring past 537. Fasteners 533 are received in elongated apertures 538 in the drive rod 530 and, in combination with adjustable stop 539 between the drive rod 530 and adapter 531, determines the overall length of the drive and consequently the degree of rotation of the pitch wheel 501 for each cycle of taping cam 527. A stop 540 is mounted to adapter 531 and coacts with bracket 534 to limit rearward movement of adapter 531.

Drive rod 531 rides in a channel 541 in a pair of blocks 542 which are mounted to each other and support plate 502 by appropriate fasteners. In a recess 543 in the leading end of drive bar 530 is a drive dog 544 pivotally mounted by pin at 545. A coiled spring 546 also on pin 545 urges the rear edge of drive dog 544 down to the bottom of recess 543 and, consequently, the leading edge of drive dog 544 up. The opening in the bottom of recess 543 is controlled (opened or closed) by pivot plate 546 which is pivotally mounted between blocks 542 by pin 547. A spring 548, in a slot 549 of blocks 542, is connected at 550 to pivot plate 546 and at the other end to post 551 mounted to blocks 542 and urges the front of pivot plate 546 down to unblock the bottom of recess 543. The rear of pivot plate 546 is connected to plunger 552 of solenoid 553 by pin 554. Solenoid 553 controls the position of pivot plate 546 and consequently the opening in the bottom of recess 543.

The leading edge of drive dog 544 engages the tooth periphery of index wheel 555 and rotates it one component distance during the forward stroke of drive rod 530. The index wheel 555, through shaft 556, rotates the pitch wheel 501. If the control system 700 detects that there is no component at the forming station 400, the index wheel 555 should not be rotated since to do so would put a gap in the tape where a component should be. The main driving assembly 600 provides one revolution per cycle to all assemblies (magazine 100, transport 200, straightening 300, forming 400 and taping 500). To prevent rotation of index wheel 555 even though drive bar 530 is moved forward by taping cam 527 and shaft 526, control system 700 actuates solenoid 553 to pull plunger 552 down which rotates the front of pivot plate 546 up to block the bottom of recess 543. By closing the bottom of recess 543, the leading edge of drive dog 544 is held down and, consequently, will not advance the index wheel as it moves forward. A spring loaded plunger 556 (FIG. 23) engages the periphery of index wheel 555 and prevents rotation of the index wheel 555 except for the positive force exerted by drive dog 544.

Rotation of index wheel 555 and shaft 556 rotates pitch wheels 501 and a sprocket 557 (FIG. 3) also mounted to shaft 556 on the other side of support plate 502. Sprocket 557, via belt 558 and sprocket 559 (FIG. 22), rotates roller 521 (FIG. 21) to advance the taped components from the pitch wheel 501. The advancement creates a slack in the tape between roller 521 and take-up reel 519 so as to rotate roller 522 down and close limit switch 558' by cam 559' (FIG. 22). The closing of limit switch 558' activates motor 560 to rotate via belt 561 and sprocket 562 take-up reel 519 until the slack of the taped components is removed.

MAIN DRIVING ASSEMBLY 600

An AC motor 601 and associated clutch and brake is mounted below table 50 and is connected to a main drive shaft 602 by belt 603 and sprocket 604 through opening 51 in table 50. The main drive shaft 602 is received at one end in support 605 and the other end in tape support plate 502. Belt 137 of the magazine assembly 100 is connected to main drive shaft by sprocket 606, belt 201 of the transport assembly 200 by sprocket 607, and belt 524 of the taping assembly 500 and the forming station 400 by sprocket 608. The main drive shaft 602 is connected to the straightening assembly 300 by sprocket 609, belt 610, sprocket 611, shaft 612 (in support 613) and cam 614. The required timing and motion of the push rod 320 of the straightening assembly 300 is produced by the cam 614 and cam follower 326.

CONTROL SYSTEM 700

Figure 24:
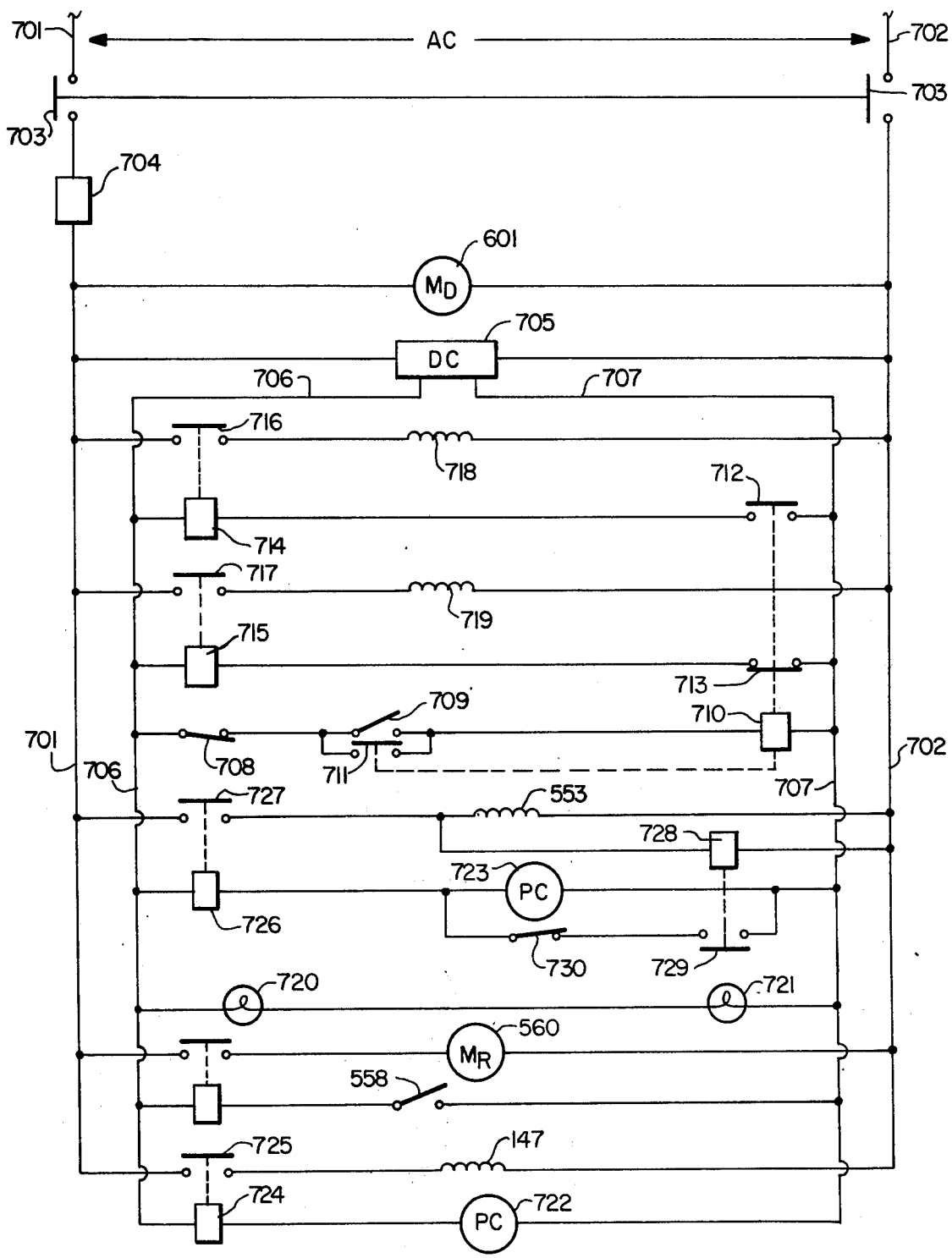
FIG. 24 is an electrical schematic of the control system of the present invention.

As illustrated in FIG. 24, the control system uses an AC input across two lines 701 and 702. In the lines 701,702 are ganged power up switch 703 and a fuse 704 in line 701. Connected across lines 701 and 702 is the motor control for the main drive motor 601 and an AC to DC converter 705 which has output lines 706 and 707. Connected between DC lines 706 and 707 is a normally closed off switch 708 in series with a normally open on switch 709 in series with a relay 710. By momentarily closing on switch 709, relay 710 closes normally open contact 711 which is in parallel with the on switch 709 and keeps relay 710 activated until deactivated by opening off switch 708.

Activated relay 710 also closes normally open contacts 712 and opens normally closed contacts 713 which are in series with relays 714 and 715, respectively. Contacts 716 and 717, in series with clutch solenoid 718 and brake solenoid 719, respectively, of main drive motor 601, are controlled by relays 714 and 715, respectively. Thus, by closing on switch 709, the drive motor 601 (which is activated by power switch 703) is allowed to drive the assemblies of the present invention by the releasing of the brake and activating the clutch output through control of their respective solenoids 718 and 719.

Figure 4:
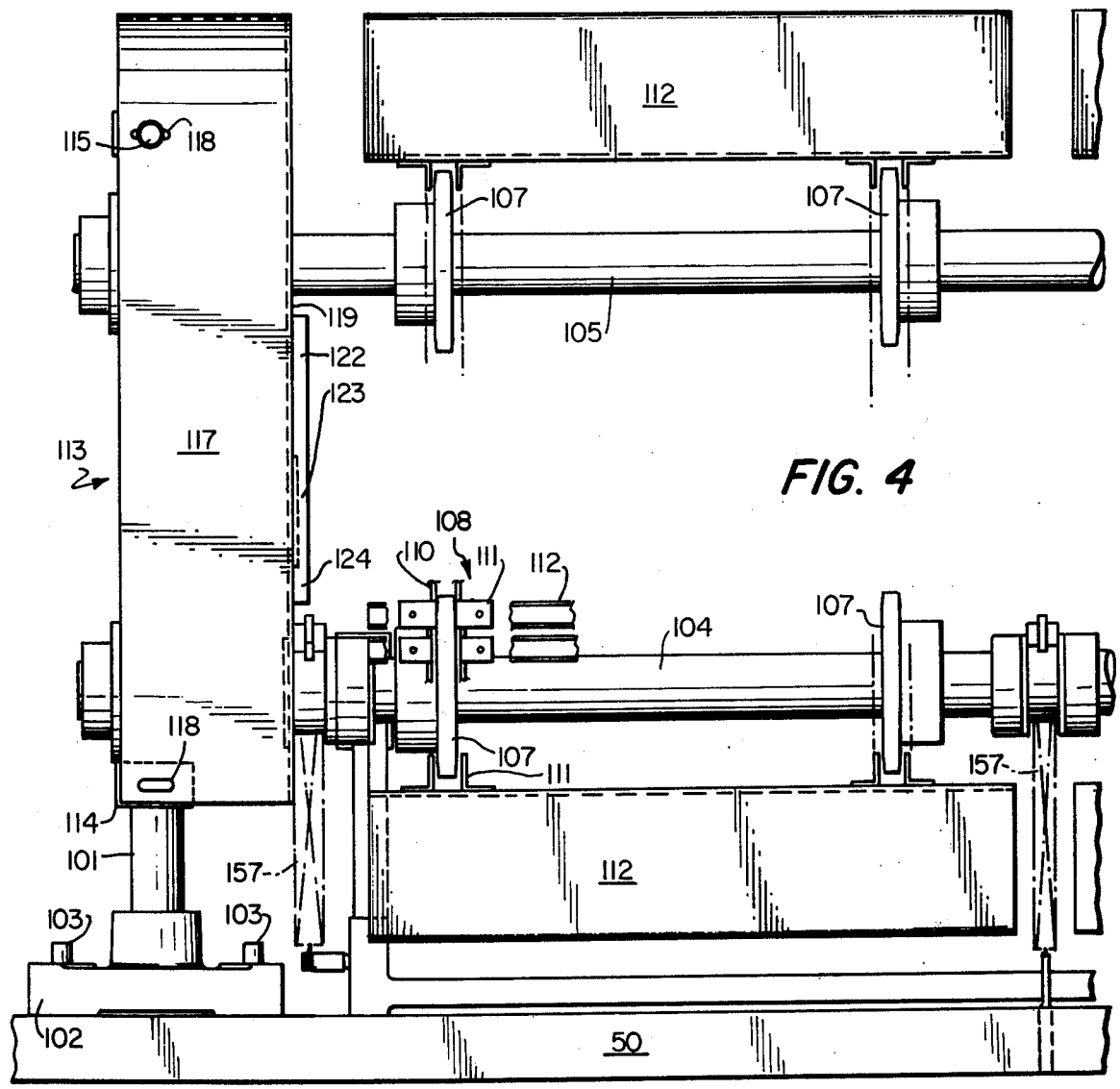
FIG. 4 is a partial front elevation of the magazine assembly of the present invention.

Connected in series across DC lines 706 and 707 are two lamps 720 and 721 which are used with photocells 722 and 723, respectively. Photocell 722 is in series with relay 724 which controls contacts 725 that are in series with magazine assembly solenoid 147. The photocell 722 and lamp 720, as shown in FIGS. 3 and 4, detects the trailing edge of the manufacturing strip of the disc capacitors and activates solenoid 147 to release stop dog 144 and permit dispensing of another manufacturing strip to the transport assembly 200.

Photocell 723 is in series with relay 726 which controls contacts 727 that are in series, across AC lines 701 and 702, with the taping drive solenoid 533. In parallel with solenoid 553 is relay 728 which controls contacts 729 that are in series with limit switch 730 across photocell 723. The light source 721 and photocell 723 are shown in FIG. 18 mounted to the forming station support 401 and detects the absence of a disc capacitor at the forming station. Normally closed limit switch 730 is held open by cam 731 mounted to shaft 526 in the home or beginning of cycle position (See FIGS. 3 and 22). If a disc capacitor is not at the forming station, photocell 723 is activated, which activates solenoid 553, through relay 726 and contacts 727, to prevent the incrementing of index wheel 555 and pitch wheels 501. Since the forming mechanisms block light to photocell 723 after the beginning of the cycle, relay 728 (also activated by relay 726) closes contacts 729 to keep relay 726 activated. At the end of the cycle, limit switch 730 is opened by cam 731 to deactivate relay 726 and, consequently, tape inhibiting solenoid 553.

From the preceding description of the preferred embodiments, it is evident that the objects of the invention are attained to provide an apparatus to tape in a substantially axial lead configuration, non-axial lead components delivered in their manufacturing strips. Although the invention has been described and illustrated in detail, it is to be clearly understood that the same is by way of illustration and example only and is not to be taken by way of limitation. The spirit and scope of this invention are limited only by the terms of the appended claims.

What is claimed is:

1. A device for removing non-axial lead electrical components from a manufacturing strip and forming the leads into a substantially axial lead configuration comprising:
    a base;
    support means mounted to said base to locate and support said manufacturing strip;
    holder means slidably mounted to said base;
    gripper means mounted to said holder means for engaging the leads of said electrical component and removing said electrical component from said manufacturing strip by lateral movement of said holder means;
    forming means mounted to said holder means for bending the axial leads into a substantially axial lead configuration; and
    drive means connected to said holder means, gripper means and forming means for causing said gripper means to engage said leads, said holder means to move laterally to remove said components from the manufacturing strips and said forming means to bend said leads.

2. The device of claim 1 wherein said holder means includes a slide means slidably mounted to said base and a tool holder means pivotally mounted to slide means to rotate about a first axis, said gripping means and said forming means are mounted to said tool holder means, said drive means causes said tool holder means to rotate said gripping means and said forming means into the plane of said electrical component.

3. The device of claim 2 wherein said gripper means includes a pair of grippers, pivotally mounted to said tool holder means to rotate about a second axis perpendicular to said first axis, to secure the electrical component to the tool holder means.

4. The device of claim 3 including a caming means in said tool holder means and positioned by said drive means for caming each gripper so as to rotate towards each other and towards a portion of said tool holder means situated therebetween to thereby hold a lead between said portion and a gripper.

5. The device of claim 4 wherein said drive means includes an actuating means between said pair of grippers for forcing said grippers to rotate opposite the direction produced by caming means.

6. The device of claim 5 wherein each of said grippers includes a first cam surface on which said actuating means rides, said first cam surface is contoured so that said actuating means forces said grippers apart while said tool holder means is rotating up and allows said grippers to come together while said tool holder means moves laterally; and includes a second cam surface on which said caming means rides, said second cam surface is contoured so that said caming means allows said actuating means to force said grippers apart and forces said grippers together.

7. The device of claim 2 wherein said forming means includes a pair of wipers, pivotally mounted to said tool holder means, to rotate about a second axis perpendicular to said first axis for bending the parallel leads of said electrical component outward approximately 90°.

8. The device of claim 7 including caming means in said tool holder means and positioned by said drive means for caming each wiper to rotate towards each other between said parallel leads and said drive means includes an actuating means between said pair of wipers for forcing said wipers to rotate opposite the direction produced by said caming means to bend said leads.

* * * * *